(12) United States Patent
Peng et al.

(10) Patent No.: US 10,224,330 B2
(45) Date of Patent: Mar. 5, 2019

(54) SELF-ALIGNED JUNCTION STRUCTURES

(71) Applicant: GLOBALFOUNDRIES INC., Grand Cayman (KY)

(72) Inventors: Jianwei Peng, Latham, NY (US); Xusheng Wu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/407,960

(22) Filed: Jan. 17, 2017

(65) Prior Publication Data
US 2018/0204840 A1  Jul. 19, 2018

(51) Int. Cl.
| | | |
|---|---|---|
| H01L 27/00 | (2006.01) | |
| H01L 27/092 | (2006.01) | |
| H01L 29/161 | (2006.01) | |
| H01L 21/8238 | (2006.01) | |
| H01L 29/66 | (2006.01) | |
| H01L 21/308 | (2006.01) | |

(52) U.S. Cl.
CPC ...... *H01L 27/0924* (2013.01); *H01L 21/3081* (2013.01); *H01L 21/823821* (2013.01); *H01L 21/823864* (2013.01); *H01L 29/161* (2013.01); *H01L 29/6681* (2013.01); *H01L 21/823807* (2013.01)

(58) Field of Classification Search
CPC ............ H01L 27/0924; H01L 21/3081; H01L 21/823821; H01L 21/823864; H01L 21/823807
See application file for complete search history.

(56) References Cited

U.S. PATENT DOCUMENTS

2015/0325473 A1* 11/2015 Niimi ................ H01L 21/76802
                                                                      257/774
2016/0148846 A1*  5/2016 Ok .................... H01L 21/28008
                                                                      257/369

* cited by examiner

*Primary Examiner* — Matthew L Reames
(74) *Attorney, Agent, or Firm* — Francois Pagette; Andrew M. Calderon; Roberts Mlotkowski Safran Cole & Calderon P.C.

(57) ABSTRACT

The present disclosure relates to semiconductor structures and, more particularly, to self-aligned junction structures and methods of manufacture. The structure includes: a plurality of epitaxial grown fin structures for first type devices; and a plurality epitaxial grown fin structures for second type devices having sidewall liners.

19 Claims, 5 Drawing Sheets

SELF-ALIGNED JUNCTION STRUCTURES

FIELD OF THE INVENTION

The present disclosure relates to semiconductor structures and, more particularly, to self-aligned junction structures and methods of manufacture.

BACKGROUND

Formation of nFET and pFET devices on a wafer requires complicated semiconductor fabrication processes. For example, patterning of an nFET and pFET on a single wafer requires two masking and lithography steps, followed by separate etching processes, e.g., reactive ion etching (RIE). These separate masking steps add significant time and cost to the manufacturing process.

In addition, it is very difficult to align two separate masks for the nFET and pFET devices. The misalignment of the masks results in a gap between such misaligned masks. Due to misalignment of the masks (gap), subsequent etching steps create a bump between the nFET and pFET. This bump, in turn, causes complications in downstream fabrication processes. For example, due to the bump, complicated fabrication processes are required in replacement metal gate processes to open the poly. These complicated fabrication processes also add significant time and cost to the manufacturing process.

SUMMARY

In an aspect of the disclosure, a structure comprises: a plurality of epitaxial grown fin structures for first type devices; and a plurality epitaxial grown fin structures for second type devices having sidewall liners.

In an aspect of the disclosure, a method comprises: forming a plurality of epitaxial grown fin structures on a first side of a substrate, while protecting fin structures on a second side of the substrate with sidewall liner; removing the fin structures on the second side of the substrate, while protecting the epitaxial grown fin structures on the first side of the substrate with oxide interlevel dielectric material; and forming a plurality of epitaxial grown fin structures on the second side of the substrate, while protecting the epitaxial grown fin structures on the first side of the substrate with liner material.

In an aspect of the disclosure, a method comprises: depositing amorphous Si material on a plurality of fin structures formed on a first side of the substrate and a second side of the substrate; protecting the amorphous Si material on the second side of the substrate while removing the amorphous material on the first side of the substrate; recessing the amorphous Si material on the second side under a hardmask material; forming a sidewall barrier layer on an exposed surface of the recessed amorphous Si material under the hardmask; replacing the plurality of fin structures on the first side of the substrate with epitaxial grown fin structures; forming liner material on the epitaxial fin structures on the first side of the substrate and the sidewall barrier layer to protect the second side during subsequent fabrication processes; forming interlevel dielectric material on the liner material; and replacing the plurality of fin structures on the second side of the substrate with epitaxial grown fin structures.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to self-aligned junction structures and methods of manufacture. More specifically, the present disclosure discloses self-aligned junction patterning processes in FinFET technology and related structures. Advantageously, the present disclosure provides a self-aligned junction integration scheme that offers nFET and pFET patterning with a single mask and without a bump formed between the nFET and pFET devices. By not introducing any bump and using only a single mask, the process of record can be significantly simplified, which provides significant cost reductions.

In embodiments, the self-aligned junction integration process utilizes poly and a barrier film deposited on its sidewall to seal part of a wafer, followed by a fill of oxide to process the other part of the wafer. In addition, the nFET and pFET can be formed as an immersion layer as described herein.

The self-aligned junction structures of the present disclosure can be manufactured in a number of ways using a number of different tools. In general, though, the methodologies and tools are used to form structures with dimensions in the micrometer and nanometer scale. The methodologies, i.e., technologies, employed to manufacture the self-aligned junction structures of the present disclosure have been adopted from integrated circuit (IC) technology. For example, the structures are built on wafers and are realized in films of material patterned by photolithographic processes on the top of a wafer. In particular, the fabrication of the self-aligned junction structures uses three basic building blocks: (i) deposition of thin films of material on a substrate, (ii) applying a patterned mask on top of the films by photolithographic imaging, and (iii) etching the films selectively to the mask.

Figure 1:
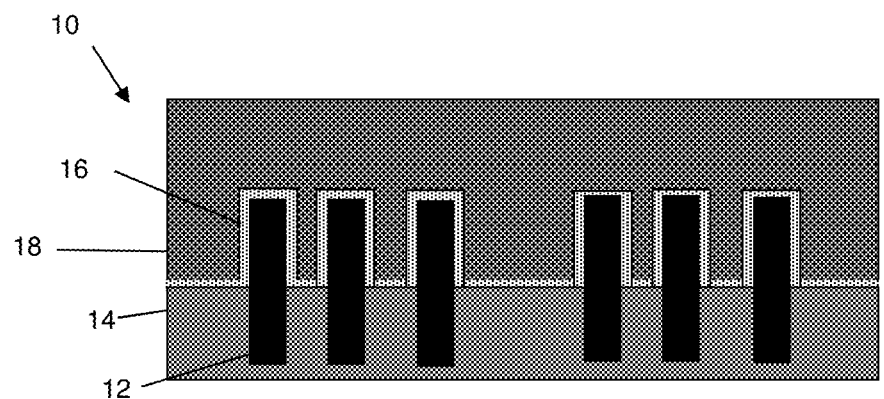
FIG. 1 shows fin structures, amongst other features, and respective fabrication processes in accordance with aspects of the disclosure.

FIG. 1 shows a structure and respective fabrication processes in accordance with aspects of the disclosure. In particular, the structure 10 includes a plurality of fin structures 12. The fin structures 12 can be formed from single crystalline semiconductor material, e.g., Si. In embodiments, the fin structures 12 can be formed from any single crystalline semiconductor material including, but not limited to, Si, SiGe, SiGeC, SiC, GaAs, InAs, InP, and other III/V or II/VI compound semiconductors.

By way of example, the fin structures 12 can be formed by conventional sidewall image transfer (SIT) processes. In an example of a SIT technique, a mandrel material, e.g., $SiO_2$, is deposited on the semiconductor material using conventional CVD processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the fin structures 12. Spacers are formed on the sidewalls of the mandrels which are preferably material that is different than the mandrels, and which are formed using conventional deposition processes known to those of skill in the art. The spacers can have a width which matches the dimensions of the narrow fin structures 12, for example. The mandrels are removed or stripped using a conventional etching process, selective to the mandrel material. An etching is then performed within the spacing of the spacers to form the sub-lithographic features. The sidewall spacers can then be stripped. In embodiments, the fin structures 12 can also be formed during this or other patterning processes, or through other conventional patterning processes, as contemplated by the present disclosure. In embodiments, the fin structures 12 can be formed from bulk material or silicon on insulator (SOI) substrate material.

Still referring to FIG. 1, shallow trench isolation (STI) structures 14 are formed using conventional lithography, etching (RIE) and deposition processes. In embodiments, the shallow trench isolation structures 14 can be formed from deposition of oxide material; although other insulator materials can also be used herein. After the deposition process, the oxide or other insulator material is etched back to expose the fin structures 12.

FIG. 1 further shows a spacer material 16 deposited on the fin structures 12 and insulator material 14 (e.g., STI structures). In embodiments, the spacer material 16 can be deposited by an atomic layer deposition (ALD) process or a chemical vapor deposition (CVD) process, as examples, to a thickness of about 12 nm or less, for example. In further embodiments, the thickness of the spacer material 16 can be about 1 nm to about 40 nm; although other dimensions are contemplated herein. The spacer material 16 is preferably a low-k dielectric material. For example, the spacer material 16 can be SiOCN, as an example.

An amorphous semiconductor material 18 is deposited over the spacer material 16, followed by a planarization process, e.g., chemical mechanical polishing (CMP). In embodiments, the amorphous semiconductor material 18 is a-Si material deposited by a low pressure chemical vapor deposition (LPCVD) process. In the integration scheme provided herein, the amorphous semiconductor material 18 will act as the mask to separate the nFET and pFET junction formation processes, making use of the superior etch selective between the amorphous semiconductor material 18 and the hardmask materials, e.g., oxide, nitride or oxynitride.

Figure 2:
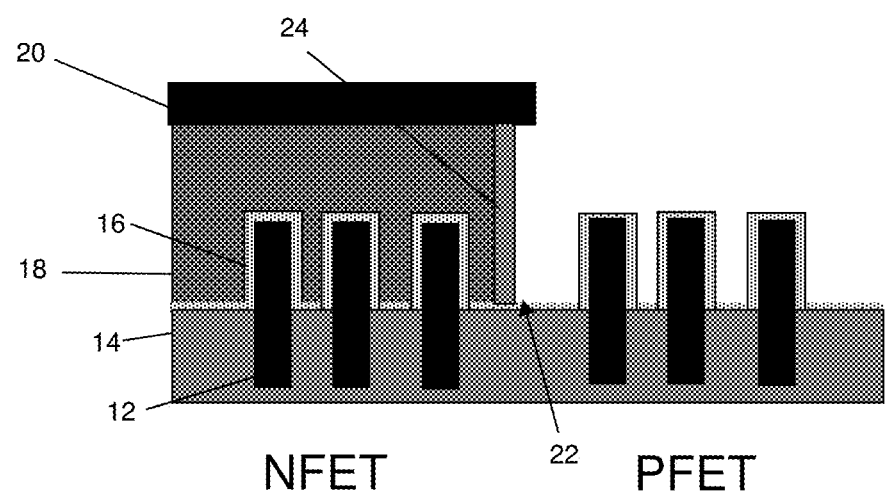
FIG. 2 shows exposed fin structures on a first side of the structure, amongst other features, and respective fabrication processes in accordance with aspects of the disclosure.

In FIG. 2, a hardmask 20 is deposited and patterned on an nFET side of the structure. In embodiments, the hardmask material 20 is preferably a different material than the spacer material 16. For example, the hardmask 20 is SiN or SiON material; although other materials are also contemplated herein. The patterning of the hardmask 20 can be performed by conventional lithography and RIE processes to expose the amorphous semiconductor material 18 on a pFET side of the structure. For example, a resist formed over the hardmask 20 is exposed to energy (light) to form a pattern (opening). An etching process with a selective chemistry, e.g., reactive ion etching (RIE), is then used to remove the hardmask 20 over the pFET side of the structure.

Following the hardmask patterning, the amorphous semiconductor material 18 can be removed by conventional etching processes, e.g., RIE, using chemistries selective to the amorphous semiconductor material 18. The amorphous semiconductor material 18 under the hardmask 20 can also be slightly recessed by an isotropic etching process as represented by reference numeral 22. In embodiments, the recess can be about 2 nm to about 5 nm. The resist can be removed by a conventional oxygen ashing process or other known stripants.

Still referring to FIG. 2, alternative methods are possible to deposit a sidewall barrier on the exposed surface of the amorphous Si, including an oxidation process performed on the exposed surface of the amorphous semiconductor material 18, and a deposition process for another isolation material, including but not limited to SiN, SiON and SiOCN. The sidewall barrier layer 24 is intentionally embedded below the hardmask material 20 to protect it from damage during subsequent RIE processes, etc. In embodiments, the sidewall barrier layer 24 is an oxide material formed by an a-Si oxidation process. For example, the a-Si oxidation process includes placing the structure in an oxygen furnace at low temperature followed by a rapid thermal anneal (RTA) process. In embodiments, the low temperature process can be below 700° C. and preferably between about 600° C. to about 700° C. Another method is to directly deposit a second spacer film. In embodiments, the oxidation process will form a sidewall barrier layer 24 used to protect the amorphous semiconductor material 18 on the nFET side of the structure during subsequent fabrication processes.

Figure 3:
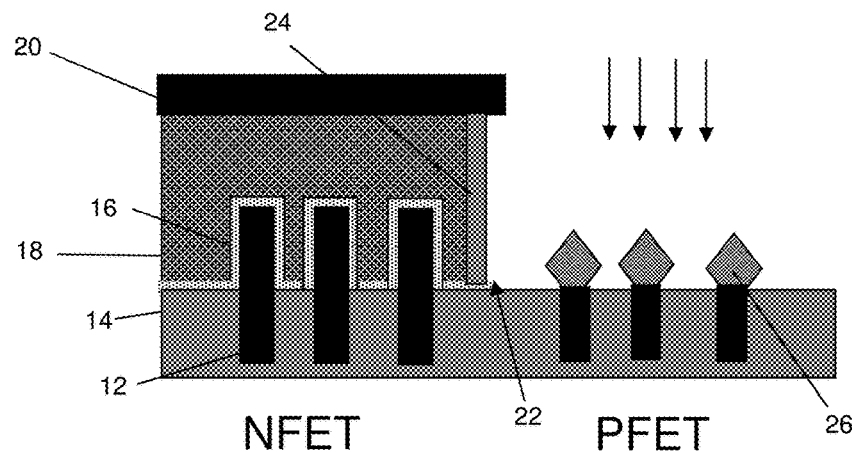
FIG. 3 shows grown epitaxial fin structures on the first side of the structure, amongst other features, and respective fabrication processes in accordance with aspects of the disclosure.

In FIG. 3, the fin structures 12 on the pFET side of the structure are recessed or pulled down to the insulator material 14. In embodiments, the fin structures 12 can be recessed or pulled down by a conventional RIE process, selective to the material of the fin structures 12. During this process, the sidewall barrier layer 24 will protect the amorphous semiconductor material 18 on the nFET side of the structure.

Still referring to FIG. 3, an epitaxial growth process is performed to grow the fin structures above the oxide material 14, e.g., to form pFET fin structures 26. During this growth process, the sidewall barrier layer 24 will prevent epitaxial growth on the a-Si material 18. In embodiments, the epitaxial growth process grows eSiGe material on the exposed portions of the fin structures on the pFET side of the structure; although other semiconductor material can also be used in this process, depending on the design parameters of the device. A conventional source and drain implant process is performed to form source and drain regions, as represented by the arrows in FIG. 3.

Figure 4A:
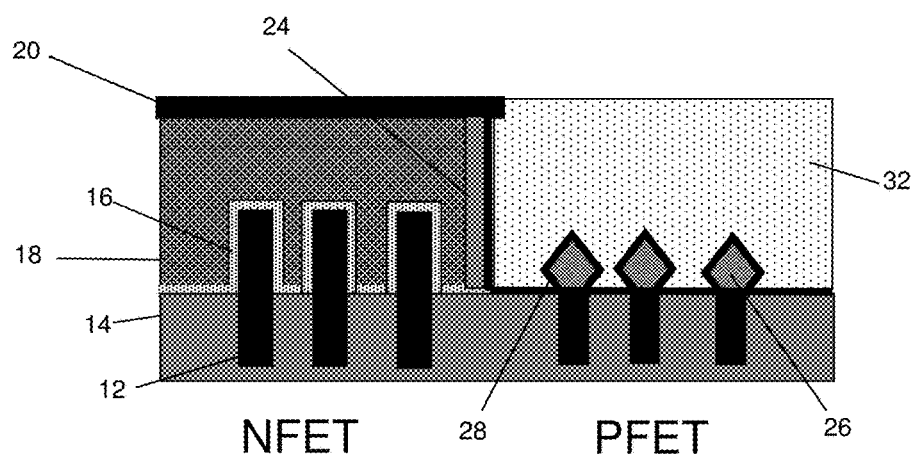
FIGS. 4A and 4B show liner and dielectric material formed on the epitaxial fin structures of the first side of the structure, amongst other features, and respective fabrication processes in accordance with aspects of the disclosure.
Figure 4B:
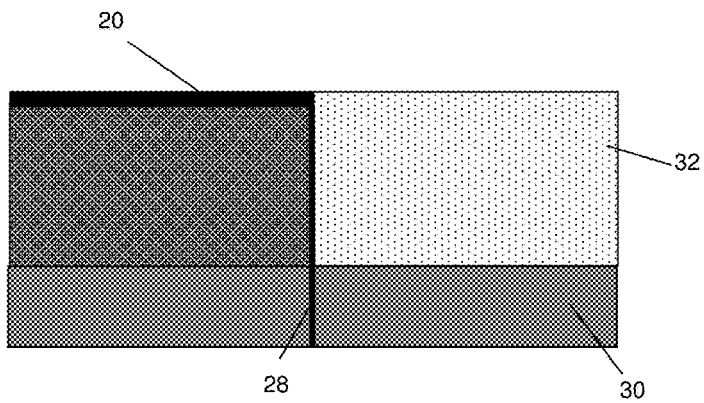

FIGS. 4A and 4B show additional structures and respective fabrication processes in accordance with aspects of the disclosure. In embodiments, the structure shown in FIG. 4A is a cross-sectional view along the epitaxial grown fin structure 26; whereas, the structure shown in FIG. 4B is a cross-sectional view along the gate structure 30. As shown in FIGS. 4A and 4B, a liner material 28 is deposited on the epitaxial fin structures 26, and over a portion of the gate structure 30. The liner material 28 is also deposited on the barrier layer 24 which will protect the pFET side of the structure during subsequent fabrication processes. In embodiments, the liner material 28 can be SiN, deposited by a conventional deposition process, e.g., ALD. In embodiments, the liner material 28 is a low-k dielectric material, e.g., SiN, deposited to a thickness of about 1 nm to about 40 nm; although other dimensions are contemplated herein.

An insulator layer 32 is formed over the liner material 32 and the gate structure 30. In embodiments, the insulator layer 32 can be an oxide material deposited by a conventional CVD process. The insulator layer 32 can be planarized by a conventional CMP process to the level of the hardmask 20. In embodiments, the insulator layer 32 is a an interlevel dielectric material 30, e.g., $SiO_2$, deposited on the spacer material 28 using a conventional CVD process.

Figure 5A:
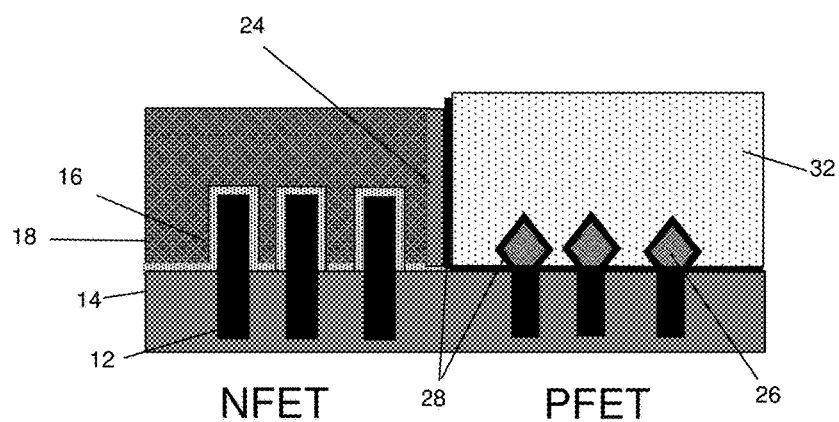
FIGS. 5A and 5B show exposed amorphous material on a second side of the structure, amongst other features, and respective fabrication processes in accordance with aspects of the disclosure.
Figure 5B:
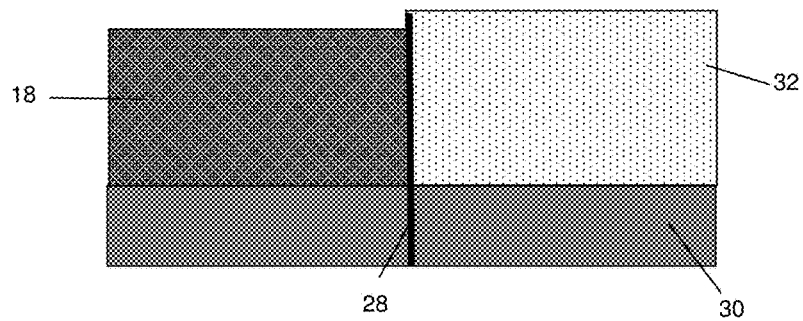

FIGS. 5A and 5B show additional structures and respective fabrication processes in accordance with aspects of the disclosure. In embodiments, the structure shown in FIG. 5A is a cross-sectional view along the epitaxial grown fin structure 26; whereas, the structure shown in FIG. 5B is a cross-sectional view along the gate structure 30. As shown in these figures, the hardmask 20 is removed over the amorphous semiconductor material 18 on the nFET side of the structure. In embodiments, the hardmask 20 is removed be a selective RIE process to the hardmask material, e.g., SiN.

Figure 6A:
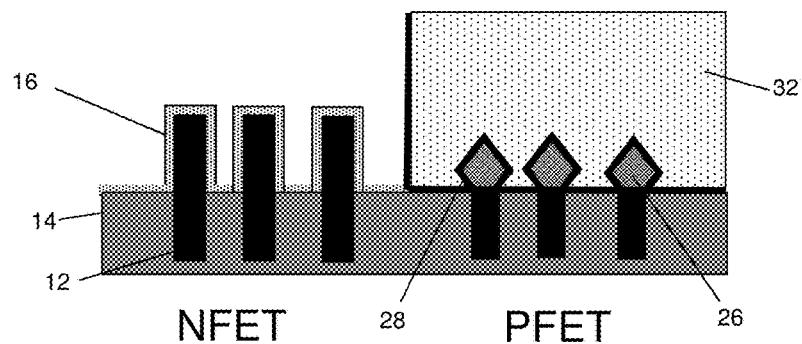
FIGS. 6A and 6B show exposed fin structures on the second side of the structure, amongst other features, and respective fabrication processes in accordance with aspects of the disclosure.
Figure 6B:
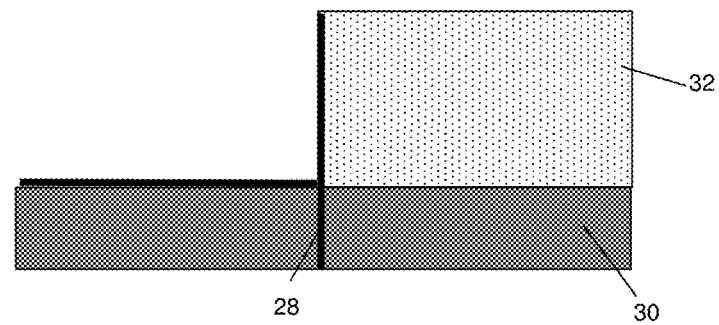

FIGS. 6A and 6B show additional structures and respective fabrication processes in accordance with aspects of the disclosure. In embodiments, the structure shown in FIG. 6A is a cross-sectional view along the epitaxial grown fin structure 26; whereas, the structure shown in FIG. 6B is a cross-sectional view along the gate structure 30. As shown in these figures, the amorphous semiconductor material 18 is removed on the nFET side of the structure by a pull down process. For example, the amorphous semiconductor material 18 can be removed by a conventional RIE process, with chemistries selective to the amorphous semiconductor material 18. During the pull down process, the oxide material 32 will protect the fin structure 26 on the pFET side of the structure, and the spacer material 16 will protect the fin structure 12 on the nFET side of the structure. After the amorphous Si pull, additional spacer material could be deposited to adjust the spacer thickness on nFET side independently to meet device requirements. In this way, the two spacer deposition processes can control the spacer thickness independently on the NFET or PFET.

Figure 7:
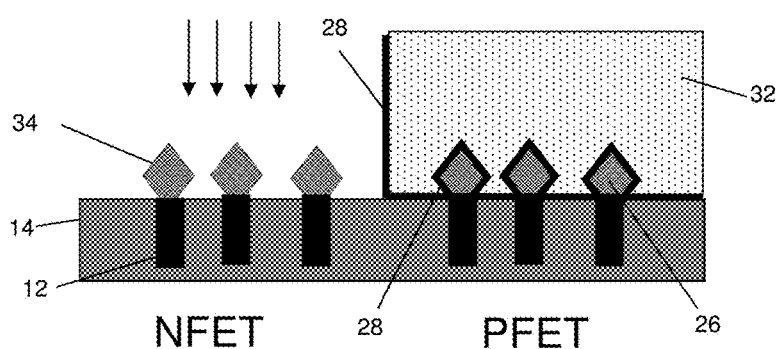
FIG. 7 shows grown epitaxial fin structures on the second side of the structure, amongst other features, and respective fabrication processes in accordance with aspects of the disclosure.

FIG. 7 shows epitaxial fin structures grown on the second side of the structure, e.g., nFET side, amongst other features, and respective fabrication processes in accordance with aspects of the disclosure. For example, the spacer material 16 is removed from the fin structures, followed by a recess or pull down of the fin structures 12 on the nFET side of the device. During this process, the oxide material 32 will protect the fin structure 26 and insulator material 32 on the pFET side of the structure during these processes.

An epitaxial growth process is performed to grow the fin structures above the oxide material 14, as represented by reference numeral 34. In embodiments, the epitaxial growth process grows eSiP material on the exposed portions of the fin structures 12 on the nFET side of the structure; although other semiconductor material can also be used in this process, depending on the design parameters of the device. A source and drain implant process is then performed to form source and drain regions, as represented by the arrows in FIG. 7. The epitaxial fin structures 34 for the nFET device are devoid of any liner or spacer material.

It should be understood that the process steps described herein can be reversed, such that epitaxial fins and spacers are formed on the nFET side of the structure prior to the pFET side of the structure. In any scenario, though, it is now possible with the spacer integration scheme described herein to prevent a bump formed between nFET and pFET devices. Also, by implementing the spacer integration scheme described herein, it is possible to eliminate an additional masking steps for the formation of the pFET and nFET devices, as required in conventional integration schemes.

Figure 8:
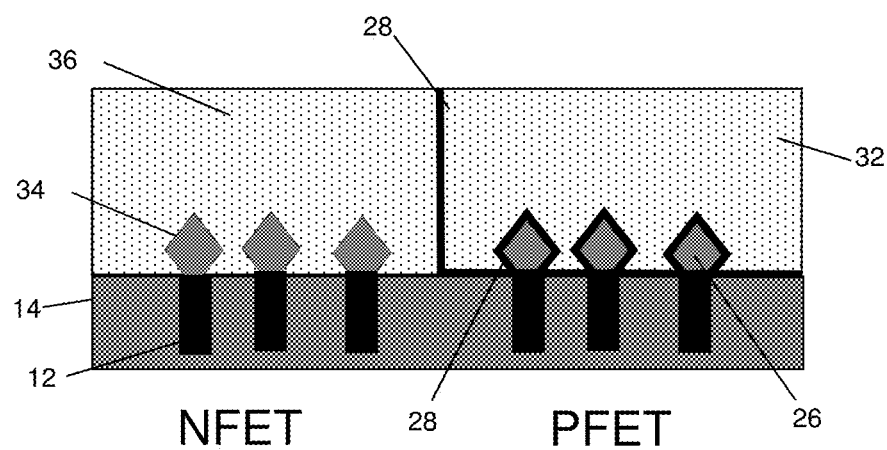
FIG. 8 shows interlevel dielectric material on the epitaxial fin structures grown on the second side of the structure, amongst other features, and respective fabrication processes in accordance with aspects of the disclosure.

FIG. 8 shows insulator material 36, e.g., interlevel dielectric material, deposited on the epitaxial fin structures 34 grown on the nFET side of the structure. In embodiments, the insulator material 36 can be deposited by a conventional deposition process, e.g., CVD. Conventional back end of the line processes, including silicide and contact formation can then be performed.

As should be understood by those of skill in the art, the silicide process begins with deposition of a thin transition metal layer, e.g., nickel, cobalt or titanium, over fully formed and patterned semiconductor devices (e.g., doped or ion implanted source and drain regions and respective devices, e.g., nFET and pFET devices. After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material. Contact formation is performed by a conventional lithography, etching and deposition process, followed by a planarization process. The contacts can be, e.g., copper, aluminum or other conductive material.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a plurality of epitaxial fin structures for first type devices, the first type devices comprising a gate with associated source and drain regions;
   a plurality of epitaxial fin structures for second type devices, the second type devices comprising a gate having sidewall liners and associated source and drain regions; and
   oxide material covering the plurality of epitaxial fin structures for first type of device and the second type devices including their associated source and drain regions, the oxide material directly contacting the plurality of epitaxial fin structures for second type of device;
   a liner material directly contacting the plurality of epitaxial fin structures for first type devices, which is positioned between the oxide material and the plurality epitaxial fin structures for the first type devices, and the liner material directly in contact with and separating the oxide material over the plurality of epitaxial fin structures for the first type devices and second type devices to separate the epitaxial fin structures for nFET devices and the epitaxial fin structures for pFET devices.

2. The structure of claim 1, wherein the first type devices are nFET devices and the second type devices are pFET devices.

3. The structure of claim 2, wherein the plurality of epitaxial fin structures for the pFET devices are eSiGe fin structures.

4. The structure of claim 2, wherein the sidewall liners of the epitaxial fin structures for the pFET devices is low-k material.

5. The structure of claim 1, wherein the epitaxial fin structures for the other of the nFET devices or pFET devices, respectively, are devoid of a liner or spacer material.

6. A method, comprising:
   forming a plurality of epitaxial grown fin structures on a first side of a substrate, while protecting fin structures on a second side of the substrate with amorphous material lined with a sidewall liner;
   removing portions of the fin structures on the second side of the substrate, while protecting the epitaxial grown fin structures on the first side of the substrate with oxide interlevel dielectric material; and
   forming a plurality of epitaxial grown fin structures on the second side of the substrate, while protecting the epitaxial grown fin structures on the first side of the substrate with liner material.

7. The method of claim 6, wherein the fin structures on the second side of the substrate are protected by the a-Si material and the sidewall liner.

8. The method of claim 7, wherein the sidewall liner is formed on a-Si material at a junction between the first side and the second side, wherein the sidewall liner is one of thermal oxide and additional deposited spacer.

9. The method of claim 8, wherein the sidewall liner is formed in recessed a-Si material under a hardmask material.

10. The method of claim 9, wherein the hardmask material is SiN which protects the a-Si material during the removal of portions of the fin structures on the first side of the substrate and the sidewall barrier liner protects epitaxial growth on the a-Si material during the forming of the plurality of epitaxial grown fin structures on the first side of the substrate.

11. The method of claim 7, wherein an oxidized barrier liner protects interlevel dielectric material over the plurality of epitaxial grown fin structures on the first side of the substrate.

12. The method of claim 6, wherein the plurality of epitaxial grown fin structures on the first side and the second side of the substrate are eSiGe grown material.

13. The method of claim 12, further comprising forming liner material on the epitaxial grown fin structures on the first side and over oxidized barrier liner.

14. The method of claim 13, further comprising forming interlevel dielectric material on liner material, over the epitaxial grown fin structures on the first side of the substrate.

15. The method of claim 14, wherein the forming of the plurality of epitaxial grown fin structures on the first side and second side of the substrate includes removal of portions of fins structures on the first side followed by an epitaxial grown process of SiGe material, and removal of fins structures on the second side followed by the epitaxial grown process of SiP material.

16. A method comprising:
   depositing amorphous Si material on a plurality of fin structures formed on a first side of the substrate and a second side of the substrate;
   protecting the amorphous Si material on the second side of the substrate while removing the amorphous material on the first side of the substrate;
   recessing the amorphous Si material on the second side under a hardmask material;
   forming an sidewall barrier layer on an exposed surface of the recessed amorphous Si material under the hardmask;
   replacing the plurality of fin structures on the first side of the substrate with epitaxial grown fin structures;
   forming liner material on the epitaxial fin structures on the first side of the substrate and the sidewall barrier layer to protect the second side during subsequent fabrication processes;
   forming interlevel dielectric material on the liner material; and
   replacing the plurality of fin structures on the second side of the substrate with epitaxial grown fin structures.

17. The method of claim 16, wherein the liner material protects the interlevel dielectric material and the epitaxial fin structures on the first side of the substrate.

18. The method of claim 16, wherein the replacing the plurality of fin structures on the second side of the substrate with epitaxial grown fin structures comprises recessing the fin structures on the second side of the substrate, while protecting the epitaxial fin structures on the first side with the liner material, and epitaxially growing SiP material on exposed portions the recessed fin structures on the second side of the substrate.

19. The method of claim 16, wherein the epitaxial fin structures on the first side are for pFET devices and the epitaxial fin structures on the second side are for nFET devices.

* * * * *